United States Patent [19]

Nakagawa et al.

[11] 4,242,602
[45] Dec. 30, 1980

[54] PHASE COMPARATOR CIRCUIT WITH GATED ISOLATION CIRCUIT

[75] Inventors: Isao Nakagawa; Keiichi Mizutani, both of Katsuta, Japan

[73] Assignee: Hitachi, Ltd., Japan

[21] Appl. No.: 967,051

[22] Filed: Dec. 6, 1978

[30] Foreign Application Priority Data

Dec. 7, 1977 [JP] Japan .............................. 52/146054

[51] Int. Cl.$^3$ .............................................. H03L 7/06
[52] U.S. Cl. .................................... 307/232; 307/246
[58] Field of Search ...................... 307/232, 246, 233

[56] References Cited

U.S. PATENT DOCUMENTS

| | | | |
|---|---|---|---|
| 3,863,080 | 1/1975 | Steckler | 307/232 X |
| 3,870,900 | 3/1975 | Malaviya | 307/232 |
| 3,970,868 | 7/1976 | Clements et al. | 307/232 |

*Primary Examiner*—John S. Heyman

*Attorney, Agent, or Firm*—Craig & Antonelli

[57] ABSTRACT

A phase comparator circuit suited for use in a PLL circuit and for integrated circuit implementation comprises a differential amplifier having a common current path to be turned on and off by a reference signal, means for applying a pedestal or ramp wave signal to be phase-compared with the reference signal to one input terminal of the differential amplifier, and means for branching a current from one of current paths of the differential amplifier. The phase comparator circuit further comprises a load resistor connected between the branching node and a reference D.C. voltage source, and a gate for turning on and off the path between the load resistor and reference D.C. voltage source. The gate is controlled by the reference signal such that the gate conducts in synchronism with the operation of the differential amplifier, that is, when the differential amplifier is in its on-state.

3 Claims, 12 Drawing Figures

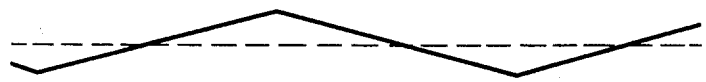
FIG. 3a
FIG. 3b
FIG. 3c
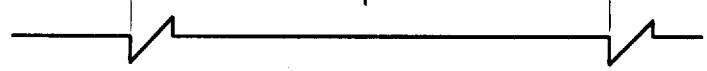
FIG. 3d
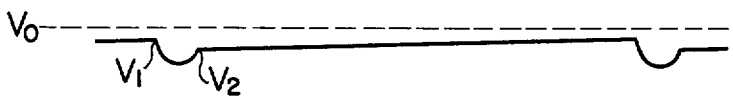
FIG. 4
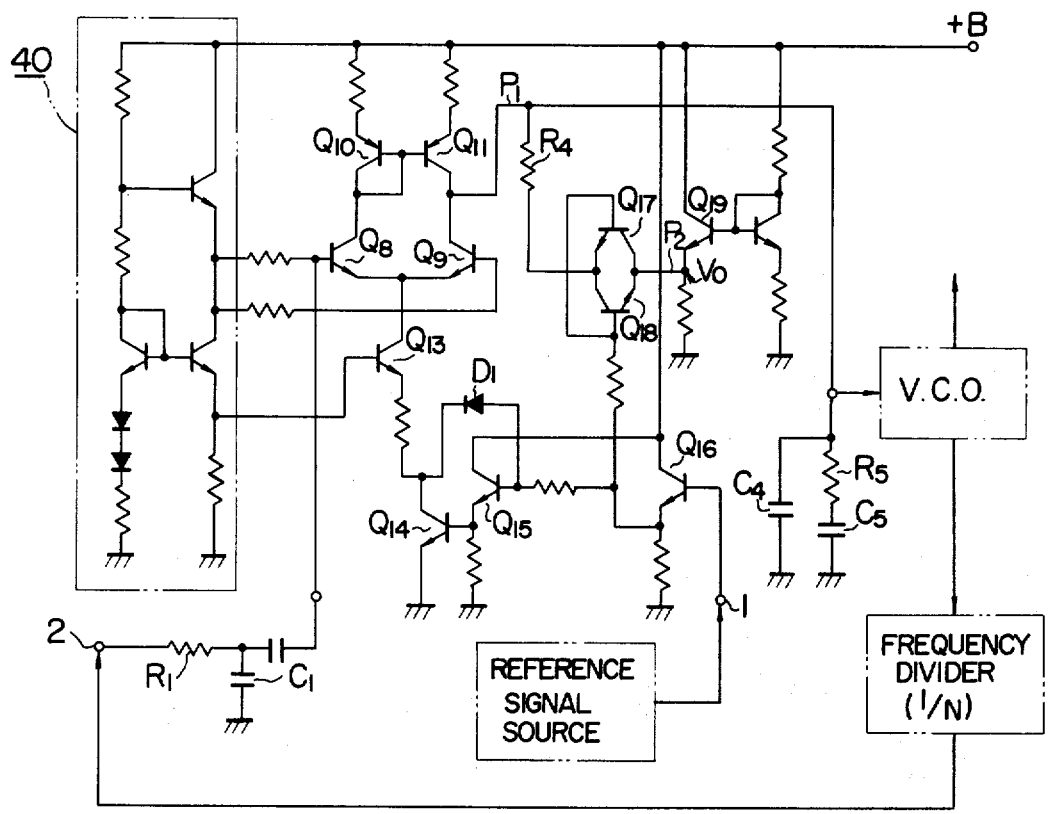

PHASE COMPARATOR CIRCUIT WITH GATED ISOLATION CIRCUIT

BACKGROUND OF THE INVENTION

The present invention relates to a phase comparator circuit suited for a phase locked loop, and more particularly to a phase comparator circuit adapted to implemented by a semiconductor integrated circuit.

Recently, phase locked loop (hereinafter abridged as PLL) technology has been frequently used in a frequency synthesizers, demodulator circuits or the like in the field of electronic communication. The PLL technology relates to a technology which generates a signal in synchronism with a reference frequency or a multiple thereof of a reference signal. Taking an example of the frequency synthesizer, a basic configuration of the PLL technology is explained below.

A PLL circuit comprises a phase comparator circuit which receives a reference signal at one input terminal, a low-pass filter which permit the output of the phase comparator circuit to pass therethrough, a voltage controlled oscillator (hereinafter abridged as VCO) which is controlled by the output of the phase comparator circuit passed through the low-pass filter and a frequency divider which frequency-divides the output of the VCO by a factor of N and applies the frequency-divided output to the other input terminal of the phase comparator circuit. The output signal having a frequency fv from the frequency divider is phase-compared with the reference signal having a frequency fr applied to the phase comparator circuit, which produces an output voltage indicative of a phase difference. If the polarity of the output voltage of the phase comparator is selected such that it lowers an oscillation frequency fo of the VCO when the phase of the output signal of the frequency divider is leading relative to the phase of the reference signal, the phase of the output signal of the frequency divider gradually leads relative to the phase of the reference signal when fv is higher than fr so that the oscillation frequency fo and hence fv = fo/N are lowered. When the frequency fv of the output signal of the frequency divider exactly coincides with the frequency fr of the reference signal, the circuit assumes a stable state with a phase difference being such that the phase comparator produces a control voltage necessary to keep a free running frequency fo' of the VCO at fo (=N·fr). In this manner, the output of the VCO produces a signal having a frequency which is exactly N times as high as the frequency of the reference signal.

The phase comparator circuit frequently used in the PLL may be a sample and hold circuit combined with a waveform converter circuit for converting the signal to be phase-compared to a sawtooth wave, a ramp wave or the like. An example of an integrated circuit implementation of such circuit is shown in FIG. 1, in which numeral 10 denotes a waveform converter circuit for converting the signal to be phase-compared with the reference signal to the sawtooth wave. The signal to be compared, which is applied to an input terminal 2 is converted to the sawtooth wave by a low-pass filter including a capacitor $C_1$ and a resistor $R_1$, and the sawtooth wave is amplified by a differential amplifier including transistor $Q_1$ and $Q_2$, which supplies an output signal to a succeeding stage. Numeral 20 denotes a sample and hold circuit. When a voltage which is sufficiently higher than an emitter potential of a transistor $Q_3$ is applied to an input terminal 1, transistors $Q_4$ and $Q_5$ are saturated so that an emitter of the transistor $Q_3$ is conducted to a base of a transistor $Q_6$. As a result, a capacitor $C_2$ is rapidly charged through the transistor $Q_4$ or discharged through the transistor $Q_5$ and a resistor 22 to a potential equal to the emitter potential of the transistor $Q_3$. When the voltage at the input terminal 1 falls, the transistors $Q_4$ and $Q_5$ are cut off so that the emitter circuit of the transistor $Q_3$ is disconnected from the base of the transistor $Q_6$. Thus, when the voltage at the input terminal 1 is low, there is no discharging path for the charge stored in the capacitor $C_2$ and the base voltage of the transistor $Q_6$ is kept constant until the voltage at the input terminal 1 rises subsequently. Namely, when the reference pulse signal is applied to the input terminal 1, portions of the sawtooth wave from the waveform converter circuit 10 are sampled by the reference pulse signal and a sampled voltage is held. In this manner, the ramp wave signal is compared with the pulse signal as is well known in the art.

The output of the sample and hold circuit 20 is applied to an oscillator to be controlled through a lag-lead filter 30 including resistors $R_2$ and $R_3$ and a capacitor $C_3$. A transient response characteristic of the phase control system when the phase of the signal to be phase-compared changes is determined by a time constant of the filter 30.

The sample and hold circuit described above requires a relatively large capacitance for the capacitor $C_2$ for sampling and holding, and such a capacitor must be mounted externally of the integrated circuit because it cannot be implemented by an on-chip capacitor. As a result, the integrated circuit requires additional lead terminals for the connection with the capacitor. Since the number of lead terminals largely affects the cost of the integrated circuit as is well known, it is necessary to reduce the number of terminals as much as possible.

As an example of the phase comparator circuit which does not need additional lead terminals, a circuit which uses a current Miller circuit as shown in FIG. 2 has been proposed. In FIG. 2, a signal to be phase-compared is applied to the terminal 2 while a reference pulse signal is applied to the terminal 1. Like in the previous example, the resistor $R_1$ and the capacitor $C_1$ constitute the low-pass filter for converting the signal to be phase-compared which is applied to the terminal 2 to the sawtooth wave. The sawtooth wave signal, which may be in the form of a waveform shown in FIG. 3a, is applied to a transistor $Q_8$ of a differential amplifier including the transistors $Q_8$ and $Q_9$. The reference pulse signal, which may be in the form of a waveform shown in FIG. 3b, is applied to a base of a transistor $Q_{12}$, which is a current source for the differential amplifier, so that the current source is turned on and off in response to the pulse signal. The arrangement of transistors $Q_{10}$ and $Q_{11}$ functions such that a collector current of the transistor $Q_{11}$ is identical to a collector current of the transistor $Q_{10}$ and hence a collector current of the transistor $Q_8$. As a result, a differential current between the collector currents of the transistors $Q_9$ and $Q_8$ flows to a path leading to a terminal 4. Thus, when the signals shown in FIGS. 3a and 3b are applied, the differential current between the collector currents of the transistors $Q_8$ and $Q_9$ is produced at the terminal 4 only in the on-period of the transistor $Q_{12}$, as shown in FIG. 3C. This differential current is supplied to a load circuit including a reference voltage source E, resistors $R_4$ and $R_5$ and capacitors $C_4$ and $C_5$, and a voltage is developed therein. The reference voltage source E is $V_0$ when a mean current value of the current waveform shown in FIG. 3C is zero, and it is higher or lower than $V_0$ when the mean current value is positive or negative.

As is seen from FIG. 2, the discharge paths through the resistors $R_4$ and $R_5$ always exist for the capacitors $C_4$ and $C_5$. Consequently, when the output voltage is different from $V_0$, the charges stored in the capacitors $C_4$ and $C_5$ are discharged through the resistors $R_4$ and $R_5$ or they are charged by the reference voltage source E so that the output voltage gradually approaches the reference voltage $V_0$ in any case. Thus, the circuit operates in a stable manner such that the charge discharged when the level of the reference pulse signal shown in FIG. 3b is low is supplemented during the duration of the high level or the application of the pulse, and the circuit produces an output voltage as shown in FIG. 3d. As seen from the waveform chart, an output D.C. voltage $V_1$ at the rise of the reference pulse signal (FIG. 3b) is different from an output D.C. voltage $V_2$ immediately before the fall of the reference pulse signal. As a result, the frequency fo of the oscillator which is controlled by the output D.C. voltage changes from time to time, although the change is slight, with the mean value of the oscillation frequency fo being equal to the multiple of the reference frequency N·fr. It is theoretically possible to avoid a practical problem caused by the change (hereinafter referred to as a sag) of the D.C. voltage by increasing the capacitances of the capacitors $C_4$ and $C_5$ of the low pass filter, but in such a case it is unavoidable that the oscillation frequency always changes because a frequency pull-in range of the automatic frequency control system is narrowed.

SUMMARY OF THE INVENTION

It is an object of the present invention to provide a phase comparator circuit which does not need additional lead terminals, which is suitable for integrated circuit implementation, which is free from sag of output D.C. voltage and which is suitable for a carrier generating means for frequency-converting a carrier chrominance signal in recording and reproducing a color video signal.

In order to achieve the above object, according to the present invention, there is provided a phase comparator circuit of a current Miller type in which a gate is provided between a load resistor to be connected to an output terminal and a reference voltage source, the gate being enabled in synchronism with a phase compare reference signal so that the reference voltage source is connected to the load resistor only at the instance of the phase comparison and the reference voltage source is disconnected from the load resistor to block a discharging path for a capacitor during the time period in which no substantial phase comparison occurs. By this arrangement, the occurrence of the sag is prevented and the change of oscillation frequency which would otherwise occur during the phase comparison which is instantaneously carried out for each cycle of the reference pulse signal, can be prevented.

According to the present invention, since the circuit can be implemented by the integrated circuit without requiring additional lead terminals, a PLL circuit capable of exact frequency control can be attained without increasing the cost.

BRIEF DESCRIPTION OF THE DRAWINGS

FIGS. 3a to 3d show waveforms for explaining the the operation of the circuit of FIG. 2 with the same time axis.

FIG. 4 shows an embodiment of a phase comparator circuit of the present invention.

DESCRIPTION OF THE PREFERRED EMBODIMENTS

Figure 5A:
FIGS. 5a to 5d shows waveforms for explaining the operation of FIG. 4 with the same time axis.

FIG. 4 shows an embodiment of a phase comparator circuit of the present invention. As in the prior art circuit described above, a signal to be phase-compared is applied to the terminal 2 and it is converted to a sawtooth wave as shown in FIG. 5a by the low-pass filter including the resistor $R_1$ and the capacitor $C_1$, and the output of the low-pass filter is applied to the transistor $Q_8$ of the differential amplifier. The transistors $Q_8$, $Q_9$, $Q_{10}$ and $Q_{11}$ are configured in the same manner as those in the current Miller type differential amplifier shown in FIG. 2. Numeral 40 denotes a bias circuit for stabilizing base biases of the transistors $Q_8$, $Q_9$ and $Q_{13}$. Also like in the prior art circuit described above, a reference pulse signal as shown in FIG. 5b is applied to the input terminal 1. When a transistor $Q_{16}$ is turned on by the pulse applied to the input terminal 1, transistors $Q_{15}$ and $Q_{14}$ are also turned on simultaneously. A diode $D_1$ connected between a collector of the transistor $Q_{14}$ and a base of the transistor $Q_{15}$ clamps the collector voltage of the transistor $Q_{14}$ in order to prevent the saturation of the transistor $Q_{14}$ when the collector voltage thereof drops too much and to prevent the speed-down of the operating slow. As is well known, since a base-emitter voltage of an NPN transistor is approximately 0.7 volts, the base potential of the transistor $Q_{15}$ relative to ground is approximately 1.4 volts when the transistors $Q_{14}$ and $Q_{15}$ are conductive. In the integrated circuit, since a rise voltage of a diode formed in the same semiconductor substrate is substantially equal to the base-emitter voltage of the transistor or approximately equal to 0.7 volts, the collector voltage of the transistor $Q_{14}$ is clamped to approximately 0.7 volts by the diode $D_1$.

Figure 5B:
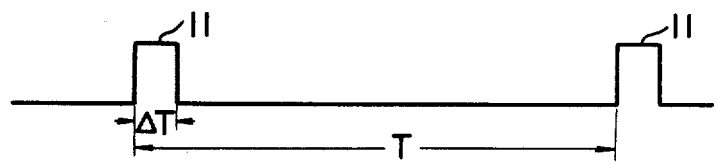
Figure 5C:
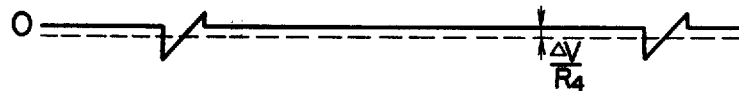

If the base bias of the transistor $Q_{13}$ is set such that the transistor $Q_{13}$ is turned on when the transistor $Q_{14}$ is turned on, the transistor $Q_{13}$ conducts in response to the pulse applied to the input terminal 1 and the differential amplifier including the transistors $Q_8$ and $Q_9$ operates. In this case, depending on the phase of the sawtooth wave shown in FIG. 5a which is applied to the base of the transistor $Q_8$, a current as shown in FIG. 5c flows in a path leading to a node $P_1$, to which the load resistor $R_4$ is connected, by the function of the current Miller circuit including the transistors $Q_{10}$ and $Q_{11}$ like in the case of FIG. 2. The other end of the load resistor $R_4$ is connected to one terminal of a gate circuit including transistors $Q_{17}$ and $Q_{18}$ while the other terminal of the gate circuit is connected to a reference voltage node $P_2$. A potential $V_0$ at the reference voltage node $P_2$ is supplied by an emitter voltage of a transistor $Q_{19}$ through which a constant current flows. When the pulse shown in FIG. 5b is applied to the input terminal 1 so that the emitter potential of the transistor $Q_{16}$ is at high level, that is, when the pulse 11 is being applied, the base potentials of the transistors $Q_{17}$ and $Q_{18}$ are sufficiently higher than the emitter and collector potentials. As a result, the transistors $Q_{17}$ and $Q_{18}$ conduct and the load resistor $R_4$ is connected to the reference voltage node $P_2$ of the reference voltage $V_0$.

Figure 5D:
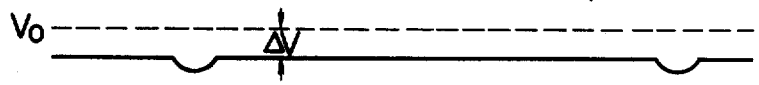

If the collector voltage of the transistor $Q_9$ is different from the reference voltage $V_0$ by $\Delta V$, a current of $(\Delta V/R_4)$ flows through the transistors $Q_{17}$ and $Q_{18}$ of the gate circuit when they are conductive. Consequently, the charges discharged from or charged in the capacitors $C_4$ and $C_5$ become zero during the conduction of the gate circuit at a time when a mean output current during the conduction of the gate circuit, that is, during the operation of the differential amplifier, reaches $(\Delta V/R_4)$. On the other hand, during the absence of the pulse 11, the transistors $Q_8$ and $Q_9$ of the differential amplifier do not operate and the base voltages of the transistors $Q_{17}$ and $Q_{18}$ of the gate circuit are low enough to reverse-bias the base-emitter and base-collector of the transistors $Q_{17}$ and $Q_{18}$. As a result, the transistors $Q_{17}$ and $Q_{18}$ are cut off and the discharging paths for the charges stored in the capacitors $C_4$ and $C_5$ no longer exist. Therefore, the output voltage keeps the constant voltage $\Delta V$ during this period as shown in FIG. 5d. Consequently, no sag occurs during the period in which the phase comparison does not take place.

Figure 2:
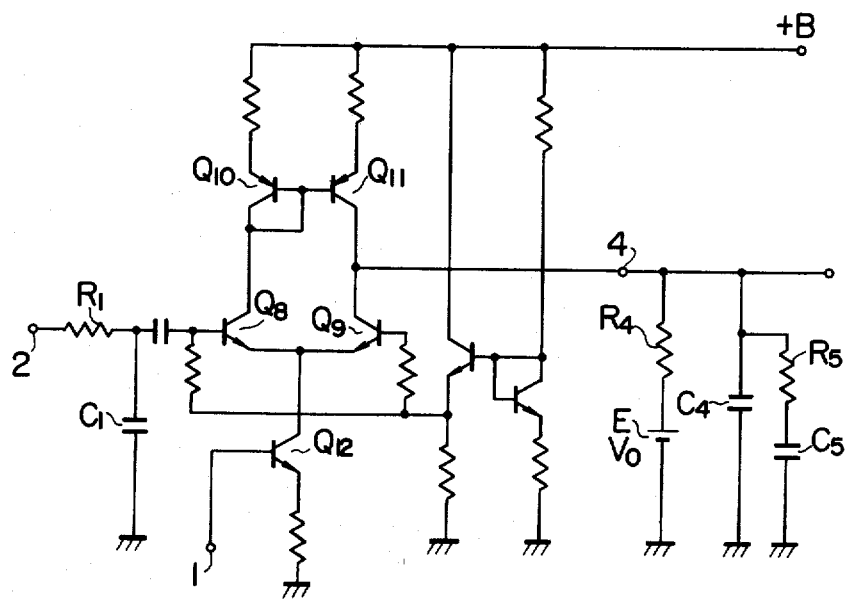
FIG. 2 shows an example of a current Miller type phase comparator circuit.

In the prior art circuit shown in FIG. 2, if a pulse duration $\Delta T$ corresponding to the phase comparison period is smaller than a cycle period T of the reference pulse, the charge discharged in a period other than the $\Delta T$ period must be supplemented in the short $\Delta T$ period. As a result, unless the resistance of the load resistor $R_4$ is sufficiently high or an operating current of the differential amplifier is sufficiently large, a sufficient output voltage will not be produced. When the resistance is high, however, a chip area so increases that it becomes difficult to form the resistor in the integrated circuit structure, and a current in the integrated circuit cannot be increased so much because of a limitation of power dissipation. On the other hand, in the embodiment of FIG. 4, since the capacitors are charged or discharged only during the $\Delta T$ period in which the phase comparison actually takes place, the charge discharged in one $\Delta T$ period is supplemented in the next $\Delta T$ period of the same length. Therefore, there is no need for the consideration of increasing the resistance of the load resistor $R_4$ or increasing the operating current of the differential amplifier. Thus, the resistor $R_4$ can be easily formed in the integrated circuit structure.

The phase comparator circuit of the present invention is particularly suited for use in the low frequency conversion recording and reproducing of a carrier chrominance signal in recording and reproducing a color video signal. When the color video signal is recorded, it is widely practiced in a magnetic recording and reproducing apparatus such as a video tape recorder to frequency-modulate a brightness signal and frequency-convert a carrier chrominance signal to a frequency band lower than a frequency band of the frequency modulated brightness signal and record the both signals. In order to frequency-convert the carrier chrominance signal to the low frequency band, it is necessary to generate a carrier in a low frequency band. Since it is necessary to establish the low frequency band carrier to have a predetermined relation with a horizontal scan frequency of the video signal, the PLL technology which uses a horizontal synchronizing signal as a reference signal is utilized.

In the magnetic recording and reproducing apparatus as represented by the video tape recorder, since a fluctuation of speed of a recording medium is usually included, the frequency of the reproduced horizontal synchronizing signal is not constant but it varies. The low frequency band carrier therefore must change to follow the change of the horizontal scan frequency. Where the fluctuation of the speed of the recording medium is included in the reproducing operation, the pulse width of the horizontal synchronizing signal changes with the fluctuation of the speed, although the change is slight. However, it is necessary that the frequency of the low frequency band carrier is not effected by the change of the pulse width of the horizontal synchronizing pulse.

Figure 1:
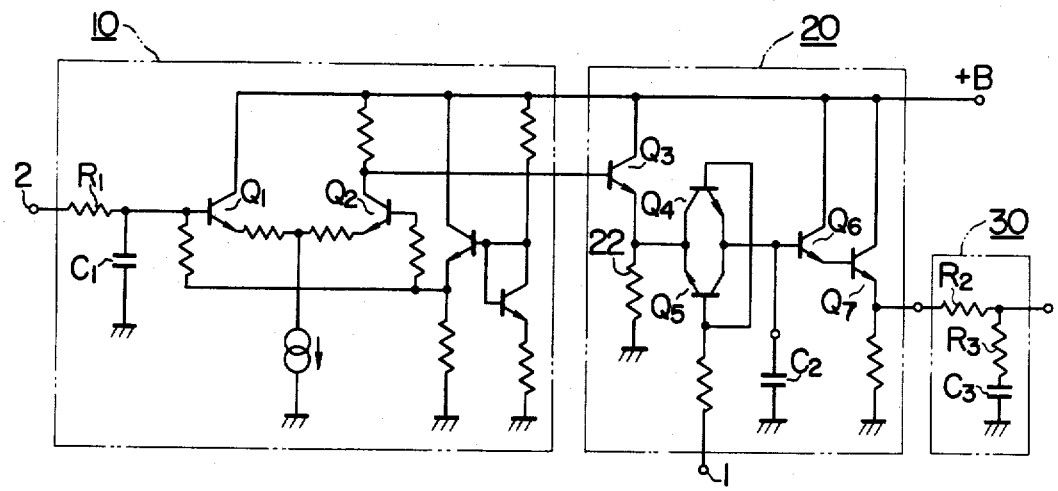
FIG. 1 shows an example of a sample and hold type phase comparator circuit.

The timing of the rise and fall of the horizontal synchronizing pulse of the video signal reproduced by the magnetic recording and reproducing apparatus is subject to the affects of not only the fluctuation of the speed but also the fluctuation of the pulse width. Since the prior art sample and hold type phase comparator shown in FIG. 1 functions to hold the voltage of the signal to be compared at the rise or fall of the reference pulse signal, the comparison output is affected by the fluctuation of the pulse width. On the other hand, in the prior art phase comparator shown in FIG. 2, since the discharging path for the capacitor in the output circuit always exists as described above, the amount of charge discharged is constant irrespective of the fluctuation of the pulse width of the horizontal synchronizing signal which is used as the reference signal. This is because the discharging takes place in a period other than the reference pulse period, that is, during a large part of each cycle and hence the slight change in the pulse width does not affect the amount of discharge. In charging mode, however, since it takes place during the duration of the horizontal synchronizing pulse which is very short, the amount of charge is subject to the affect of the fluctuation of the pulse width. Consequently, the phase of the resulting low frequency band carrier changes with the change of the pulse width of the horizontal synchronizing pulse.

Contrary to the prior art circuits described above, in the present circuit, since charging and discharging of the capacitor in the output circuit take place only during the pulse duration of the reference pulse, the amount of charge and the amount of discharge depend on the pulse width but the output signal indicative of the phase difference is determined by the mean value in the pulse duration. Accordingly, in the phase comparator circuit of the present invention, the timing at the center of the horizontal synchronizing pulse used as the reference signal has a significance but the pulse width has no significance. As a result, in the present circuit, the output signal does not depend on the pulse width of the horizontal synchronizing pulse but follows only the frequency fluctuation due to the speed fluctuation. Accordingly, the present invention is suitable for use in the PLL circuit of the low frequency band carrier generator for recording and reproducing the low frequency converted color video signal.

Figure 6:
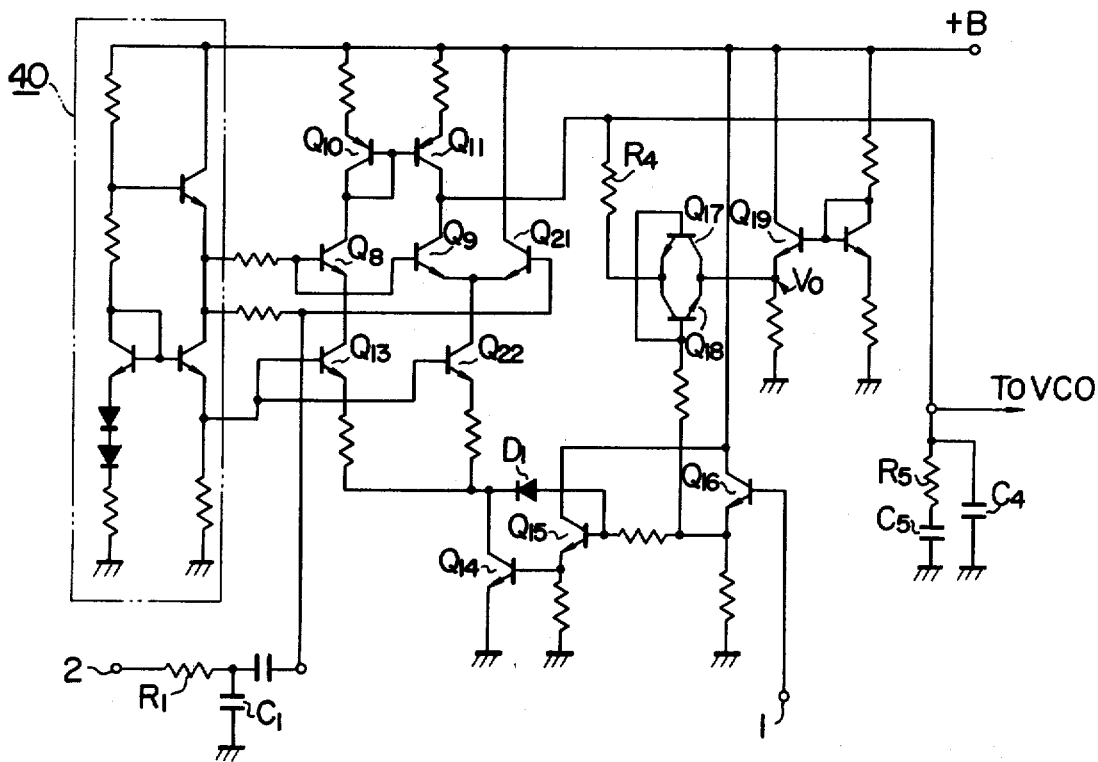
FIG. 6 shows another embodiment of the phase comparator circuit of the present invention.

The present invention may be applied to a circuit which produces the result of phase comparison in the form of current, and it is also applicable to a circuit which produces a difference from a predetermined constant current. FIG. 6 shows an another embodiment of such a circuit configuration. In FIG. 6, transistors $Q_{21}$ and $Q_{22}$ are added to form an additional differential amplifier together with the transistor $Q_9$, to which the current Miller circuit is coupled. It produces a differential current between the current in the transistor $Q_9$ of the differential amplifier including the transistors $Q_9$, $Q_{21}$ and $Q_{22}$ and the current in the transistor $Q_{11}$ through which a constant current from the current Miller flows. The remaining portions are identical to the corresponding portions in FIG. 4.

What is claimed is:

1. A phase comparator circuit suited for use in a phase locked loop and for an integrated circuit implementation comprising:
   a reference signal source for supplying a reference signal composed of pulse signals;
   means for converting a signal to be phase-compared with said reference signal to a signal of waveform having a ramp portion;
   means for receiving said reference signal and an output signal of said converting means to produce a current indicative of the voltage of said ramp portion of said output signal of said converting means during a period in which each pulse of the pulse signals of said reference signal is being applied;
   an output circuit including a load resistor for converting said current output to a voltage;
   a reference D.C. voltage node; and
   gate means connected between said load resistor and said reference D.C. voltage node and operative to conduct only when said reference pulse signal is being applied and to isolate said load resistor from said reference D.C. voltage node during the remaining period to thus maintain said output voltage substantially constant during said remaining period.

2. A phase comparator circuit according to claim 1, wherein said current producing means includes;
   a differential amplifier coupled to a current Miller circuit;
   means for applying the signal to be phase-compared derived from said converting means to one input terminal of said differential amplifier;
   switching means inserted in a common current path of said differential amplifier and adapted to be turned on and off in response to said reference signal; and
   means for branching a current from one of current paths of said differential amplifier.

3. In a phase comparator circuit which is supplied with a reference signal composed of pulse signals and a signal which is converted to a signal having a ramp portion such as a pedestal wave signal or a ramp wave signal to be phase-compared with said reference signal, so that a current indicative of the voltage of said ramp portion during a period in which each pulse of said pulse signals of said reference pulse signal is being applied is produced and then applied to a load resistor, one end of which is connected to a reference D.C. voltage node, to thereby produce a signal voltage indicative of a phase difference between said reference signal and said signal to be compared; the improvement wherein said phase comparator circuit comprises a gate circuit connected between said load resistor and said reference D.C. voltage node, said gate circuit being controlled by said pulse signals so as to connect said load resistor with said reference D.C. voltage only when each pulse of said pulse signals is being applied to thereby eliminate the change of the output voltage during a period in which each pulse of said pulse signals is not being applied.

* * * * *